United States Patent

Murayama et al.

(10) Patent No.: US 9,105,989 B2
(45) Date of Patent: Aug. 11, 2015

(54) CONNECTION STRUCTURE, WIRING SUBSTRATE UNIT, ELECTRONIC CIRCUIT PART UNIT, AND ELECTRONIC APPARATUS

(71) Applicant: SHINKO ELECTRIC INDUSTRIES CO., LTD., Nagano (JP)

(72) Inventors: Kei Murayama, Nagano (JP); Shinji Nakazawa, Nagano (JP); Miki Suzuki, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 194 days.

(21) Appl. No.: 13/867,188

(22) Filed: Apr. 22, 2013

(65) Prior Publication Data
US 2013/0284509 A1    Oct. 31, 2013

(30) Foreign Application Priority Data

Apr. 27, 2012 (JP) .................. 2012-103130

(51) Int. Cl.
| H05K 1/11 | (2006.01) |
| H01R 12/00 | (2006.01) |
| H01R 4/02 | (2006.01) |
| H05K 3/34 | (2006.01) |
| H01L 21/48 | (2006.01) |
| H01L 23/00 | (2006.01) |
| H01L 23/498 | (2006.01) |

(52) U.S. Cl.
CPC .......... *H01R 9/095* (2013.01); *H01L 21/4853* (2013.01); *H01L 23/49811* (2013.01); *H01L 24/05* (2013.01); *H01L 24/13* (2013.01); *H01L 24/16* (2013.01); *H01R 4/02* (2013.01); *H05K 3/3436* (2013.01); *H01L 24/81* (2013.01); *H01L 2224/0401* (2013.01); *H01L 2224/05541* (2013.01); *H01L 2224/05548* (2013.01); *H01L 2224/05555* (2013.01); *H01L 2224/05571* (2013.01); *H01L 2224/131* (2013.01); *H01L 2224/13005* (2013.01); *H01L 2224/13006* (2013.01); *H01L 2224/13007* (2013.01); *H01L 2224/13024* (2013.01); *H01L 2224/13082* (2013.01); *H01L 2224/13147* (2013.01); *H01L 2224/16058* (2013.01); *H01L 2224/16237* (2013.01); *H01L 2224/73204* (2013.01); *H01L 2224/81191* (2013.01); *H01L 2224/81193* (2013.01); *H05K 2201/0367* (2013.01); *H05K 2201/10674* (2013.01)

(58) Field of Classification Search
CPC .......... H01L 2224/05555; H01L 2924/00014; H01L 2224/13007; H01L 2924/00015; H01L 2224/05541; H01L 2924/207; H01L 2224/05571; H01L 2924/00012; H01L 2224/13005; H01L 2924/206; H01L 2224/131; H01L 2924/014; H01L 2224/13147; H01L 2924/0001
USPC .................. 174/260, 267
See application file for complete search history.

(56) References Cited

U.S. PATENT DOCUMENTS 5,334,804 A * 8/1994 Love et al. .............. 174/267
7,122,897 B2 * 10/2006 Aiba et al. ............... 257/738

(Continued)

FOREIGN PATENT DOCUMENTS

JP    09-051016    2/1997

*Primary Examiner* — Hoa C Nguyen
(74) *Attorney, Agent, or Firm* — IPUSA, PLLC

(57) ABSTRACT

A connection structure includes a column electrode; a first connecting portion connected to one end of the column electrode; and a second connecting portion connected to another end of the column electrode via solder, wherein a height of the column electrode is a width of the first connecting portion or greater.

3 Claims, 6 Drawing Sheets

(56) References Cited

U.S. PATENT DOCUMENTS

| | | | |
|---|---|---|---|
| 2006/0194365 A1* | 8/2006 | Haba | 438/106 |
| 2006/0223313 A1* | 10/2006 | Yoon et al. | 438/687 |
| 2008/0185705 A1* | 8/2008 | Osborn et al. | 257/690 |
| 2009/0263938 A1* | 10/2009 | Ino | 438/124 |
| 2010/0140640 A1* | 6/2010 | Shimokawa et al. | 257/98 |

* cited by examiner

CONNECTION STRUCTURE, WIRING SUBSTRATE UNIT, ELECTRONIC CIRCUIT PART UNIT, AND ELECTRONIC APPARATUS

CROSS-REFERENCE TO RELATED APPLICATIONS

This application is based upon and claims the benefit of priority of the prior Japanese Patent Application No. 2012-103130, filed on Apr. 27, 2012, the entire contents of which are incorporated herein by reference.

FIELD

The embodiments discussed herein are related to a connection structure, a wiring substrate unit, an electronic circuit part unit, and an electronic apparatus.

BACKGROUND

An example of an electronic apparatus is structured to connect a terminal electrode of an integrated circuit (IC) chip with a metallic joining portion which is formed on a land of a substrate by solder as disclosed in Japanese Laid-open Patent Publication No. 09-051016.

SUMMARY

According to an aspect of the embodiment, a connection structure includes a column electrode; a first connecting portion connected to one end of the column electrode; and a second connecting portion connected to another end of the column electrode via solder, wherein a height of the column electrode is a width of the first connecting portion or greater.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

In the electronic apparatus described previously, the height of the metallic joining portion relative to the width of the land of the substrate is insufficient. Therefore, in a case where electrons flow from the land to the metallic joining portion, electron density (current density) is unbalanced inside the metallic joining potion.

Therefore, there is a problem that electromigration of solder occurs on an interface between the metallic joining portion and the solder when the unbalance of the electron density (current density) occurs. When the electromigration of the solder occurs, an electric connection between the solder and the metallic joining portion is degraded to thereby lower reliability of the electronic apparatus.

Preferred embodiments of the present invention will be explained with reference to accompanying drawings.

Hereinafter, a connection structure, a wiring substrate, an electronic circuit part unit, and an electronic apparatus of first and second embodiments are described. Before explaining the first and second embodiments, the connection structure and the electronic apparatus of the comparative example are described by referring to FIGS. 1A to 2B.

Where the same reference symbols are attached to the same parts, repeated description of the parts is omitted.

COMPARATIVE EXAMPLE

Figure 1A:
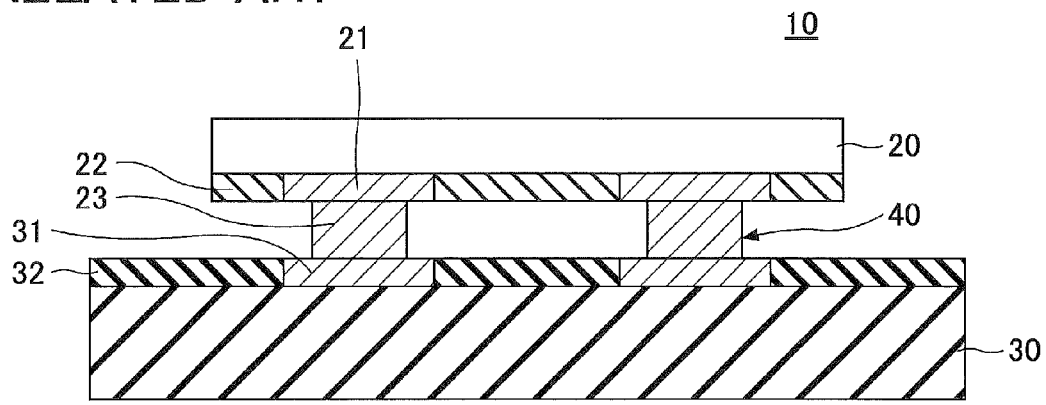
FIGS. 1A to 1C illustrate a comparative example of an electronic apparatus.
Figure 1B:
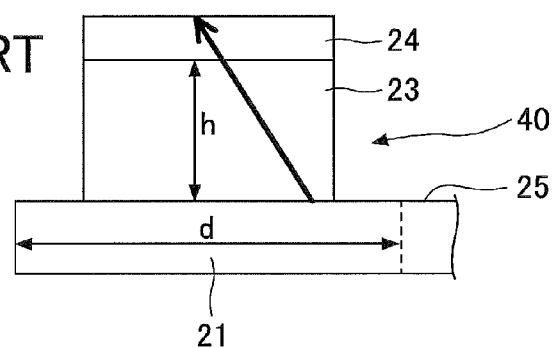
Figure 1C:
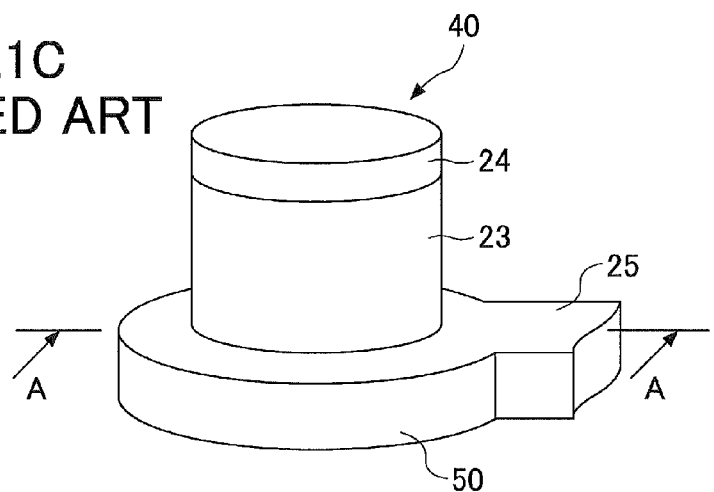

FIGS. 1A to 1C illustrate a comparative example of an electronic apparatus. FIG. 1A illustrates a cross-sectional structure of an electronic apparatus 10 of the comparative example. FIG. 1B illustrates a cross-sectional structure of a connection structure 40 of the electronic apparatus 10 of the comparative example. FIG. 1C illustrates a perspective view of the connection structure 40 of the electronic apparatus 10 of the comparative example.

As illustrated in FIG. 1A, the electronic apparatus 10 has a structure where an integrated circuit (IC) chip 20 is connected to a wiring substrate 30.

The IC chip 20 is formed with a pad 21 and a passivation film 22. A post 23 is connected on the lower side of the pad 21. The pad 21 has a laminated structure formed by laminating a nickel plating layer and a copper plating layer.

The post 23 is made of, for example, copper. The post 23 is formed by plating the lower surface of the pad 21. Further, the passivation film 22 is, for example, a polyimide resin. The passivation film 22 is formed to protect a portion of the lower surface of the IC chip 20 where the pad 21 is not formed.

A pad 31 and a solder resist 32 are formed on the surface of the wiring substrate 30. The pad 31 has a laminated structure formed by laminating a copper plating layer and a nickel plating layer. A portion of the surface of the wiring substrate 30 where the pad 31 is not formed is covered by the solder resist 32.

The electronic apparatus 10 is formed by joining the lower surface of the post 23 joined to the pad 21 of the IC chip 20 to the upper surface of the pad 31 of the wiring substrate 30 by solder (not illustrated). After joining the pad 21 to the post 23, an underfill resin may fill a space between the IC chip 20 and the wiring substrate 30. As described, the electronic apparatus 10 is manufactured by flip-chip mounting the IC chip 20 on the wiring substrate 30.

Referring to FIG. 1A, two group of the pad 21, the post 23, and the pad 31 are illustrated. However, many groups of the pad 21, the post 23, and the pad 31 may actually exist.

Further, referring to FIG. 1A, electric currents may flow in a direction from the IC chip 20 to the wiring substrate 30 and also in a direction from the wiring substrate 30 to the IC chip 20 through the many groups of the pad 21, the post 23, and the pad 31, which may actually exist.

An electric current flows from the IC chip 20 to the wiring substrate 30 through the two groups of the pad 21, the post 23, and the pad 31 illustrated in FIG. 1A. Electrons flow from the wiring substrate 30 to the IC chip 20 through the two groups of the pad 21, the post 23, and the pad 31 illustrated in FIG.

1A. The flowing direction of electrons is opposite to the flowing direction of the electric current.

Further, in the electronic apparatus 10, a structure constructed of the pad 21, the post 23, and the solder (not illustrated) is referred to as the connection structure 40.

FIGS. 1B and 1C schematically illustrate the connection structure 40 of the electronic apparatus 10 of the comparative example illustrated in FIG. 1A, where the connection structure in FIGS. 1B and 1C is illustrated upside-down relative to the connection structure in FIG. 1A. The cross-sectional shape of FIG. 1B corresponds to a cross-sectional view taken along an arrow A-A of the perspective view of FIG. 1C.

Referring to FIGS. 1B and 1C, a wiring 25 is connected to the pad 21. A border between the pad 21 and the wiring 25 is illustrated by a broken line in FIG. 1B.

Referring to FIGS. 1B and 1C, the connection structure 40 includes the pad 21, the post 23, and a solder layer 24. Electrons flow from the pad 21 to the solder layer 24 through the connection structure 40.

Referring to FIG. 1C, the pad 21 has a circular shape in its plan view, to which the wiring 25 is connected. Therefore, electrons flow into the pads 21 from the wiring 25.

Referring to FIG. 1B, the width (diameter) of the pad 21 is designated as d and the height of the post 23 is designated as h.

Ordinarily, the relationship of h<d is set in order to allow the structure to be easily manufactured. Further, the width d of the pad 21 is set to be greater than the width of the post 23. This is to easily obtain connection strength between the pad 21 and the post 23.

However, if the width d of the pad 21 is greater than the height h as illustrated in FIG. 1B by arrows, electrons flowing from the wiring 25 to the pad 21 concentrate on the side in the vicinity of the wiring 25 in the connecting portion between the pad 21 and the post 23. The electrons flow through the center portion of the post 23 in the connecting portion between the post 23 and the solder layer 24.

Therefore, the electrons do not evenly flow inside the post 23 thereby causing unbalancing in electron density inside the post 23.

If the electron density (the current density) is unbalanced, an electron density (the current density) of electrons flowing from the post 23 to the solder layer 24 is unbalanced between a connection surface between the post 23 and the solder layer 24. Therefore, electromigration locally occurs in the solder layer 24 to thereby locally damage the solder layer 24.

Said differently, the solder layer 24 is locally destroyed at a portion having a high electron density.

Figure 2A:
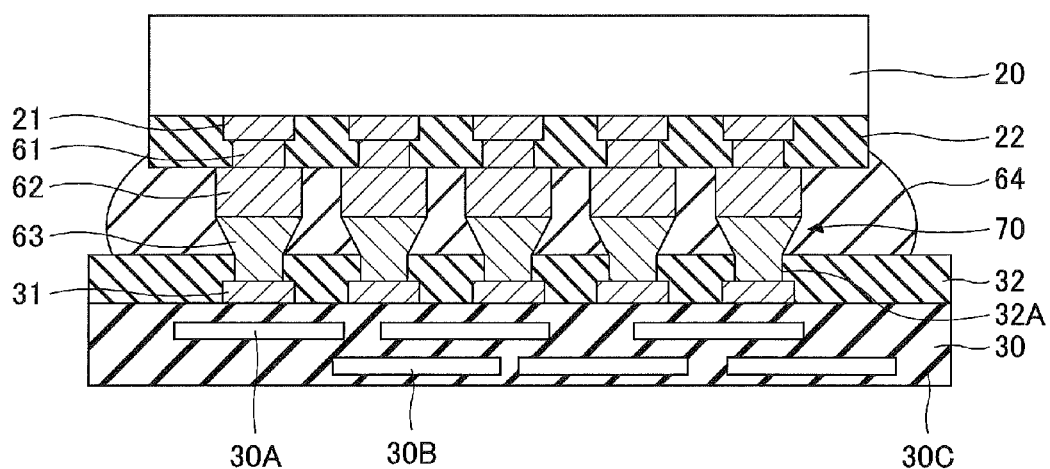
FIGS. 2A and 2B illustrate a comparative example of another electronic apparatus.
Figure 2B:
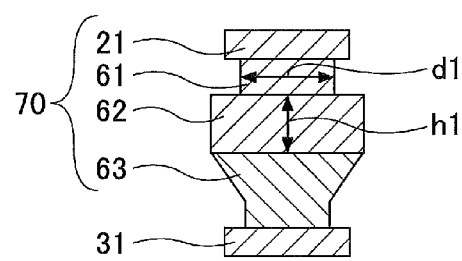

Referring to FIGS. 2A and 2B, another electronic apparatus 50 of the comparative example is illustrated. FIG. 2A illustrates a cross-sectional structure of the electronic apparatus 50, and FIG. 2B illustrates the cross-section structure of the connection structure included in the electronic apparatus 50. Referring to FIGS. 2A and 2B, the same reference symbols are attached to the structural elements similar to those of the electronic apparatus 10, and description of these structural elements is omitted.

In the electronic apparatus 50 illustrated in FIG. 2A, the IC chip 20 is flip-chip bonded to the wiring substrate 30. The pad 21 of the IC chip 20 is connected to a post 62 via a via 61. The via 61 and the post 62 are made of, for example, copper. The pad 21 and the via 61 are covered by the passivation film 22. The lower surface of the via 61 is exposed on the passivation film 22 and is connected to the post 62. The via 61 and the post 62 are formed by plating processes.

A hole 32A exposing the pad 31 on the solder resist 32 on the wiring substrate 30 is formed in the wiring substrate 30. The lower surface of the post 62 is connected to the upper surface of the pad 31 exposed on the hole 32A of the solder resist 32 by a solder layer 63.

An underfill resin 64 fills a space between the passivation film 22 and the solder resist 32. The post 62 and the solder layer 63 are covered by the underfill resin 64.

The wiring substrate 30 is a multilayer substrate formed by thermally compressing wiring layers 30A and 30B and an insulating layer 30C. The wiring layers 30A and 30B are formed by patterning, for example, a copper foil. The wiring layers 30A and 30B are connected to the pad 31 by a via or the like (not illustrated). Further, the insulating layer 30C is, for example, a thermoset resin made of an organic material such as an epoxy resin.

A connection structure 70 included in the electronic apparatus 50 is structured by the pad 21, the via 61, the post 62, and the solder layer 63 as illustrated in FIG. 2B. Referring to FIG. 2B, the pad 31 connected below the solder layer 63 is illustrated.

The width d1 of the via 61 is set to be greater than the height h1 of the post 62. Said differently, h1<d1.

Therefore, the electron density (the current density) may be unbalanced inside the post 62 when the electrons flow from the via 61 to the post 62 to thereby accelerate electromigration in the solder layer 63.

Further, in a case where electrons flow from the pad 31 to the solder layer 63, the electrons flowing from the wiring (not illustrated) to the pad 31 directly flow into the solder layer 63. Therefore, the electron density may further be unbalanced in comparison with the case where the electrons flow from the pad 21 to the solder layer 63 via the via 61 and the post 62. Therefore, in a case where the electrons flow from the pad 31 to the solder layer 63, there is a probability that electromigration in the solder layer is accelerated.

As described, because the width d of the pad 21 is greater than the height h of the post 23 in the connection structure 10 illustrated in FIGS. 1A, 1B, and 1C, the electron density inside the post 23 may be unbalanced to thereby accelerate electromigration in the solder layer 24.

Further, because the width d1 of the via 61 is greater than the height h1 of the post 62 in the connection structure 70 illustrated in FIGS. 2A and 2B, the electron density inside the post 62 may be unbalanced to thereby accelerate electromigration in the solder layer 63. This is because the electrons flowing into the post 62 from the via 61 reach the solder layer 63 before the electrons spread evenly inside the post 62.

Therefore, in a case where the electrons flow from the pad 31 directly into the solder layer 63, there is a probability that electromigration in the solder layer 63 is accelerated.

Said differently, if the distribution of electrons is unbalanced before the electrons flow into the solder layer 63, the solder layer 63 electromigration may accelerate. This is because the solder layer 63 has a specific resistance greater than those of the posts 23 and 62 and the pad 31 to thereby be apt to be damaged.

Therefore, within the first and second embodiments described below, there are provided a connection structure, a wiring substrate unit, an electronic circuit part unit, and an electronic apparatus solving the above problems.

[a] First Embodiment

Figure 3A:
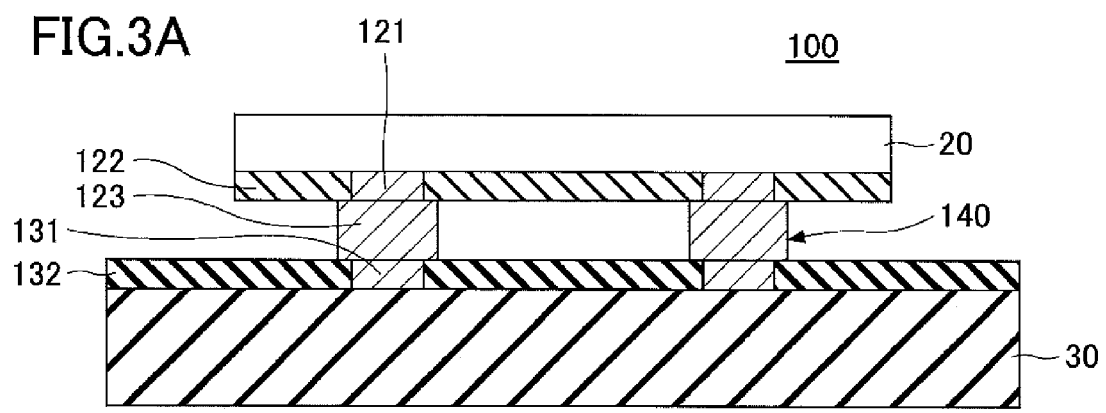
FIGS. 3A and 3B illustrate a cross-sectional structure of an electronic apparatus of a first embodiment.
Figure 3B:
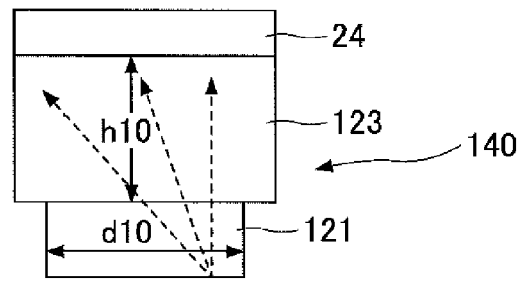

FIGS. 3A and 3B illustrate a cross-sectional structure of an electronic apparatus of a first embodiment. FIG. 3A illustrates a cross-sectional structure of an electronic apparatus 100 of the first embodiment. FIG. 3B illustrates a cross-sectional structure of the connection structure 140 of the electronic apparatus 100 of the first embodiment. Hereinafter, the same reference symbols are attached to the structural elements similar to those of the electronic apparatus 10 of the comparative example, and description of these structural elements is omitted.

As illustrated in FIG. 3A, the electronic apparatus 100 of the first embodiment has a structure where an integrated circuit (IC) chip 20 is connected to a wiring substrate 30.

The IC chip 20 is formed with a pad 121 and a passivation film 122 on the lower surface of the IC chip 20. A post 123 is connected on the lower side of the pad 121. For example, the pad 121 has a laminated structure formed by laminating a nickel plating layer and a copper plating layer. The pad 121 is an example of a first connecting portion.

The post 123 is made of, for example, copper. The post 123 is formed by plating the lower surface of the pad 121. The post 123 is an example of a column electrode. Further, the passivation film 122 is, for example, a polyimide resin. The passivation film 122 is formed to protect a portion of the lower surface of the IC chip 20 where the pad 121 is not formed.

A pad 131 and a solder resist 132 are formed on the front surface (principal surface) of the wiring substrate 30. The pad 131 has a laminated structure formed by laminating a copper plating layer and a nickel plating layer. The pad 131 is an example of a second connecting portion. A portion of the surface of the wiring substrate 30 where the pad 131 is not formed is covered by the solder resist 132.

The electronic apparatus 100 is formed by joining the lower surface of the post 123 joined to the pad 121 of the IC chip 20 to the upper surface of the pad 131 of the wiring substrate 30 by solder (not illustrated). After joining the pad 121 to the post 123, an underfill resin may fill a space between the IC chip 20 and the wiring substrate 30. As described, the electronic apparatus 100 is manufactured by flip-chip mounting the IC chip 20 on the wiring substrate 30.

Referring to FIG. 3A, two groups of the pad 121, the post 123, and the pad 131 are illustrated. However, many groups of the pad 121, the post 123, and the pad 131 may actually exist.

Further, referring to FIG. 3A, electric currents may flow in a direction from the IC chip 20 to the wiring substrate 30 and also in a direction from the wiring substrate 30 to the IC chip 20 through the many groups of the pad 121, the post 123, and the pad 131, which may actually exist. The direction of the electric current may be determined by connecting destinations of the groups (the power terminals, the ground terminals and signal terminals of the IC chips 20).

An electric current flows from the IC chip 20 to the wiring substrate 30 through the two groups of the pad 121, the post 123, and the pad 131 illustrated in FIG. 3A. Electrons flow from the wiring substrate 30 to the IC chip 20 through the two groups of the pad 121, the post 123, and the pad 131 illustrated in FIG. 3A. The flowing direction of electrons is opposite to the flowing direction of the electric current.

Further, in the electronic apparatus 100, a structure constructed of the pad 121, the post 123, and the solder (not illustrated) is referred to as the connection structure 140.

FIG. 3B schematically illustrates the connection structure 140 of the electronic apparatus 100 of the first embodiment illustrated in FIG. 3A, where the connection structure 140 of the first embodiment in FIG. 3B is illustrated upside-down relative to the connection structure 140 in FIG. 3A.

Referring to FIG. 3B, the connection structure 140 includes the pad 121, the post 123, and the solder layer 24. Electrons flow in a direction from the pad 121 to the solder layer 24 through the connection structure 140.

The pad 121 is circular in its plan view. A wiring similar to the wiring 25 illustrated in FIG. 1C is connected. Therefore, electrons flow into the pad 121 from the wiring.

Referring to FIG. 3B, the width (diameter) of the pad 121 is designated as d10 and the height of the post 123 is designated as h10.

In the connection structure 140, the height h10 of the post 123 is set to be greater than or equal to the width d10 of the pad 121. Said differently, a relationship of h10≥d10 is established.

The reason why the height h10 of the post 123 is made greater than the width d10 of the pad 121 is to equalize electron density of electrons flowing from the pad 121 to the post 123 inside the post 123.

Within the first embodiment, in a case where the electrons flow from the right side of the pad 121 to the pad 121 illustrated in FIG. 3B, the electrons may evenly flow into the inside of the post 123 as indicated by arrows of three broken lines.

Figure 4:
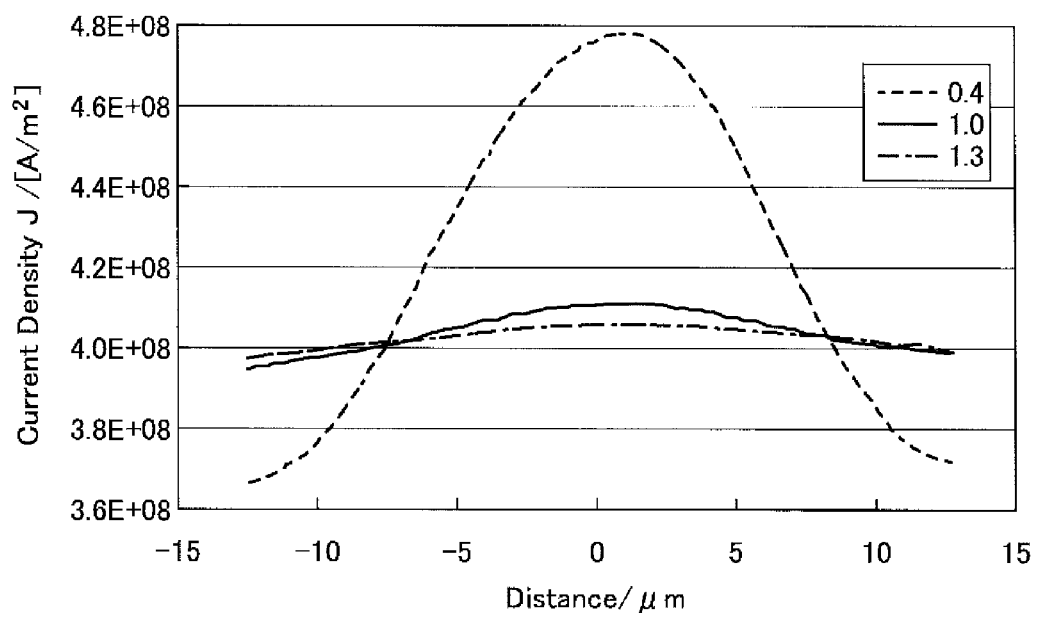
FIG. 4 is a characteristic diagram illustrating current density inside a post of a connection structure of the first embodiment.

FIG. 4 is a characteristic diagram illustrating current density inside the post 123 of the connection structure 140 of the first embodiment. Referring to FIG. 4, the current density on an interface between the post 123 and the solder layer 24 is obtained by simulation. The abscissa in FIG. 4 designates the width directions of the post 123. The center (0 μm) of the abscissa designates the center of the width directions of the post 123. Here, the current density is handled as treating electron density.

The current densities of three types of connection structures are simulated and compared. Ratios between the height h10 of the post and the width d10 of the pad 121 in the three types of connection structures are 0.4, 1.0, and 1.3. The one type of the connection structure having the ratio of 0.4 between the height h10 of the post and the width d10 of the pad 121 is provided for comparison.

Referring to FIG. 4, the current density between the post 123 and the solder layer 24 takes the maximum value of about $4.8 \times 10^8$ (A/m$^2$) in the center of the width directions of the post 123 as illustrated by the broken line. The ratio (h10/d10) between the height h10 of the post 123 and the width d10 of the pad 121 decreases less as the distance from the center increases. At the distance of ±10 μm, the current density is about $3.7 \times 10^8$ (A/m$^2$).

The current density at the center in the width directions of the post 123 is about 30% higher than the current density of the post 123 at the distance of ±10 μm in the width directions.

Meanwhile, in a case where the ratio (h10/d10) between the height h10 of the post 123 and the width d10 of the pad 121 is 1.0 as indicated by the solid line, the maximum value of the current density is about $4.1 \times 10^8$ (A/m$^2$) in the center of the width directions of the post and the values of the current density at the distance of ±10 μm from the center are about $3.95 \times 10^8$ (A/m$^2$).

In a case where the ratio (h10/d10) between the height h10 of the post 123 and the width d10 of the pad 121 is 1.0, the value of the current density at the center is about 3% to 4% greater than the value of the current density at the distance of ±10 μm from the center.

Meanwhile, in a case where the ratio (h10/d10) between the height h10 of the post 123 and the width d10 of the pad 121 is 1.3 as indicated by a dot chain line, the maximum value of the current density is about $4.05 \times 10^8$ (A/m$^2$) in the center of the width directions of the post 123 and the values at the distance of ±10 μm from the center are about $4.0 \times 10^8$ (A/m$^2$).

In a case where the ratio (h10/d10) between the height h10 of the post 123 and the width d10 of the pad 121 is 1.3, the value of the current density is about 1% greater than the values of the current density at the distance of ±10 μm from the center.

In a case where the ratio (h10/d10) between the height h10 of the post 123 and the width d10 of the pad 121 is greater than 1.3, the tendency similar to that in the ratio of 1.3 can be observed. Therefore, it is known that there is a small difference between the current density at the center in the width directions of the post 123 and the current density at the distance of ±10 μm from the center.

In a case where the ratio (h10/d10) between the height h10 of the post 123 and the width d10 of the pad 121 is smaller than 1.0, a difference between the current density at the center in the width directions of the post 123 and the current density at the distance of ±10 μm from the center gradually increases as the ratio (h10/d10) approaches 0.4.

As described, in a case where the ratio (h10/d10) between the height h10 of the post 123 and the width d10 of the pad 121 is 1.0 or greater, the value of the current density inside the post 123 is equalized to be about 3% to 4% or smaller.

In a case where the ratio (h10/d10) between the height h10 of the post 123 and the width d10 of the pad 121 is 1.0 or greater, the value of the electron density inside the post 123 can be equalized to thereby restrict electromigration of the solder layer which receives an electric current from the post 123.

As described, within the first embodiment, the connection structure 140 and the electronic apparatus 100 with their reliability being improved can be provided by restricting electromigration of the solder layer 24.

Generally, as for the life duration of the solder layer 24 based on the formula of Black, it is ordinarily said that the life duration is shortened 0.7 times when the current density is increased 1.2 times.

Within the first embodiment, since it is possible to drastically improve the distribution of the current density, the life duration of the solder layer 24 can be prolonged. Thus, it is possible to provide the connection structure 140 and the electronic apparatus 100, of which reliability is improved.

[b] Second Embodiment

Figure 5:
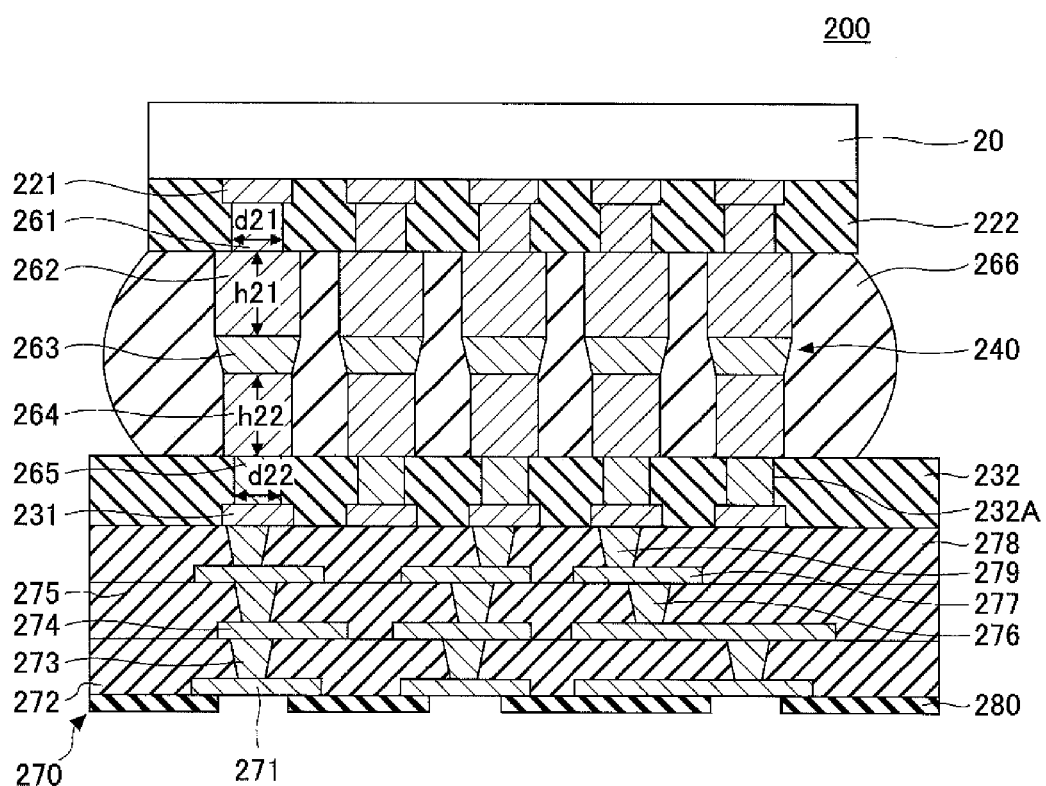
FIG. 5 illustrates a cross-sectional structure of an electronic apparatus of a second embodiment.

FIG. 5 illustrates a cross-sectional structure of an electronic apparatus 200 of a second embodiment. Referring to FIG. 5, the same reference symbols are attached to the structural elements similar to those of the electronic apparatus 100, and description of these structural elements is omitted.

The electronic apparatus 200 includes an IC chip 20, a pad 221, a passivation film 222, a via 261, a post 262, a solder layer 263, a post 264, a via 265, an underfill resin 266, a pad 231, a solder resist 232, and a wiring substrate 270.

In the electronic apparatus 200 illustrated in FIG. 5A, the IC chip 20 is flip-chip bonded to the wiring substrate 270. The pad 221 of the IC chip 20 is connected to the post 262 via the via 261. For example, the pad 221 has a laminated structure formed by laminating a nickel plating layer and a copper plating layer.

The via 261 and the post 262 are made of, for example, copper. The pad 221 and the via 261 are covered by the passivation film 222. The lower surface of the via 261 is exposed on the passivation film 222 and is connected to the post 262. The via 261 and the post 262 are formed by plating processes.

The solder resist 232 of the wiring substrate 270 has a hole 232A for causing the pad 231 to be exposed on the solder resist 232. The lower surface of the post 262 is connected to the upper surface of the post 264 by the solder layer 263. For example, the pad 231 has a laminated structure formed by laminating a nickel plating layer and a copper plating layer.

The post 264 is connected to the upper surface of the via 265. The via 265 is connected to the upper surface of the pad 231, which is exposed on the hole 232A of the solder resist 232. The via 265 and the post 264 are made of, for example, copper. The via 265 and the post 264 are formed on the upper surface of the pad 231 by plating process.

The width of the post 262 is set greater than the width of the post 264. Therefore, the solder layer 263 connecting the post 262 to the post 264 is shaped like a taper having greater width on the upper side and lesser width on the lower side in FIG. 5.

The underfill resin 266 fills a space between the passivation film 222 and the solder resist 232. The post 262, the solder layer 263, and the post 264 are covered by the underfill resin 266.

The wiring substrate 270 includes a wiring 271, an insulating layer 272, a via 273, a wiring 274, an insulating layer 275, a via 276, a wiring 277, an insulating layer 278, a via 279, and a solder resist 280.

The wiring substrate 270 is a buildup substrate (a subcomposite). The wiring substrate 270 includes the wiring 271, the insulating layer 272, the via 273, the wiring 274, the insulating layer 275, the via 276, the wiring 277, the insulating layer 278, and the via 279 formed in this order.

The wiring layer 271 is connected to the wiring layer 274 by the via 273. The wiring layer 274 is connected to the wiring layer 277 by the via 276. The wiring layer 277 is connected to the pad 231 by the via 279.

The wiring 271, the insulating layer 272, the wiring 274, the insulating layer 275, the wiring 277, and the insulating layer 278 form a multilayer substrate while the vias 273, 276, and 279 are formed by thermocompression bonding. The wiring 271, the insulating layer 272, the wiring 274, the insulating layer 275, the wiring 277, and the insulating layer 278 form a so-called buildup substrate (a subcomposite).

For example, the wirings 271, 274, and 277 are formed by patterning a copper foil. For example, the insulating layers 272, 275, and 278 may be made of a thermoset organic material such as an epoxy resin.

The vias 273, 276, and 279 are formed inside through holes formed by, for example, laser processing by a semiadditive method.

Here, the via 261, the post 262, the solder layer 263, the post 264, and the via 265 form a connection structure 240. FIG. 5 illustrates 5 groups of connection structures 240.

Further, the pad 221, the passivation film 222, the via 261, and the post 262 are connected to the IC chip 20 to thereby form an electronic circuit part unit (hereinafter, referred to as an "electronic circuit part unit"). Further, the pad 231, the solder resist 232, the via 265, and the post 264 are connected to the wiring substrate 270 to thereby form a wiring substrate unit (hereinafter, referred to as a "wiring substrate unit").

Although the electronic circuit part unit includes the IC chip 20 and the pad 221, the passivation film 222, the via 261, and the post 262 connected to the IC chip 20, the electronic circuit part unit may include electrocircuit parts (e.g., a wiring substrate on which a resister, an amplifier, or the like is mounted) other than the IC chip 20.

The electronic apparatus 200 of the second embodiment is formed by connecting the post 262 of the electronic circuit part unit with the post 264 of the wiring substrate unit using the solder layer 263 and supplying the underfill resin 266 to fill the space between the passivation film 222 and the solder resist 232.

In such an electronic apparatus 200 of the second embodiment, a width d21 of the via 261 and a height h21 of the post 262 are set so that a relationship of h21≥d21 is established.

Therefore, in a case where the via 261 is connected to the post 262 so that electrons flow from the via 261 to the post 262, the current density (electron density) inside the post 262 can be equalized to suppress electromigration of the solder layer 263, which receives the electric current flowing from the post 262.

In a case where electrons flow from the via 261 to the post 262, the via 261 is an example of a first connecting portion, the post 262 is an example of the a first column electrode, the post 264 is an example of a second column electrode, and a via 265 is an example of a second connecting portion.

A width d22 of the via 265 and a height h22 of the post 264 are determined so that a relationship of h22≥d22 is established.

Therefore, in a case where the via 265 is connected to the post 264 so that electrons flow from the via 265 to the post 264, the current density (electron density) inside the post 264 can be equalized to suppress electromigration of the solder layer 263, which receives the electric current flowing from the post 264.

In a case where electrons flow from the via 265 to the post 264, the via 265 is an example of a third connecting portion, the post 264 is an example of a third column electrode, the post 262 is an example of a fourth column electrode, and a via 261 is an example of a fourth connecting portion.

As described above, within the second embodiment, in a manner similar to the first embodiment, electromigration of the solder layer 263 is suppressed. Thus, it is possible to provide the connection structure 240, the wiring substrate unit, the electronic circuit part unit, and the electronic apparatus 200, for which reliability is improved.

An electric current may flow in either direction between the IC chip 20 and the wiring substrate 270 through 5 groups of the pads 221, the vias 261, the posts 262, the solder layers 263, the posts 264, the vias 265, and the pads 231.

Exemplary widths and thicknesses of the layers are described. However, the widths and the thicknesses are only for examples. As for the pad 221, the width (the diameter) is 25.2 μm, and the thickness is 1.5 μm. As for the via 261, the width (the diameter) is 12 μm, and the thickness is 1 μm. As for the post 262, the width (the diameter) is 25.2 μm, and the thickness is 12 μm. As for the solder layer 263, the thickness is 12 μm. As for the post 264, the width (the diameter) is 25.2 μm, and the thickness is 12 μm. As for the via 265, the width (the diameter) is 12 μm, and the thickness is 1 μm. As for the pad 231, the width (the diameter) is 25.2 μm, and the thickness is 1.5 μm.

[c] Third Embodiment

Figure 6A:
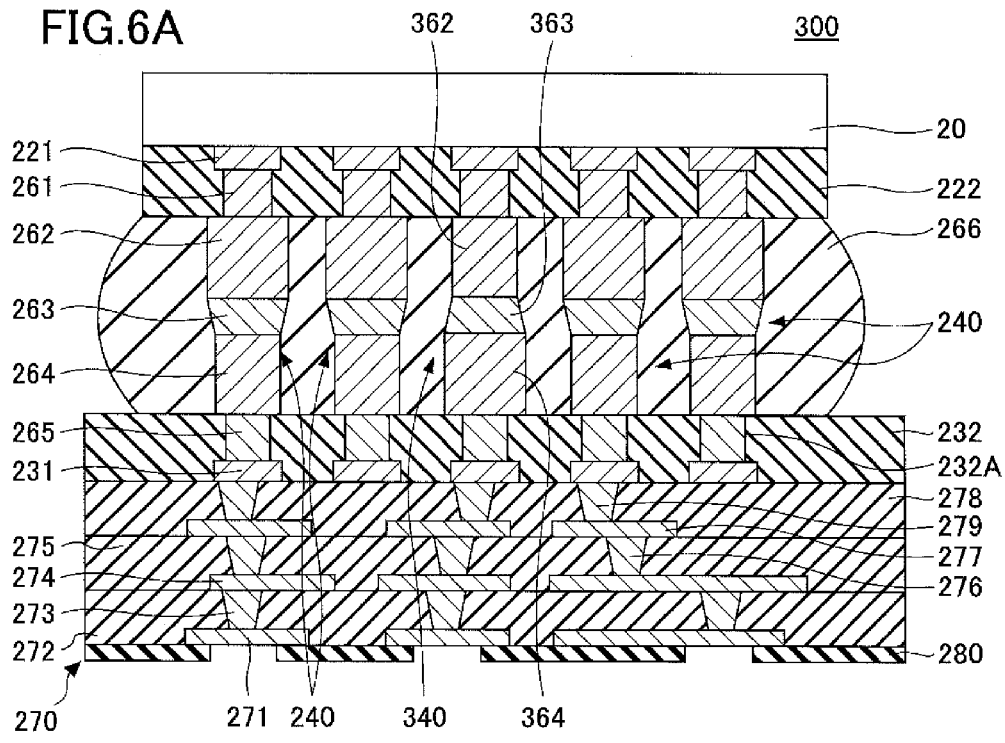
FIGS. 6A to 6C illustrate a cross-sectional structure of an electronic apparatus of a third embodiment.
Figure 6B:
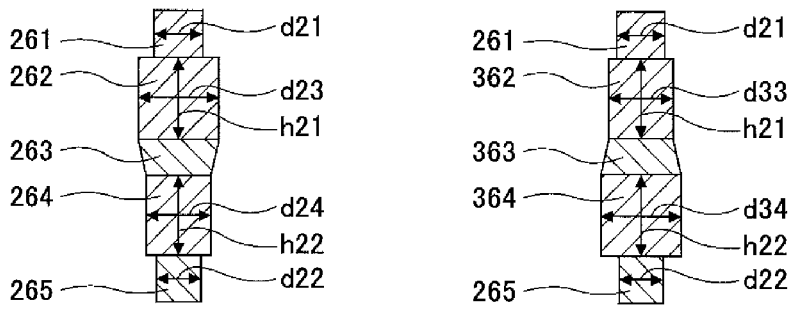
Figure 6C:
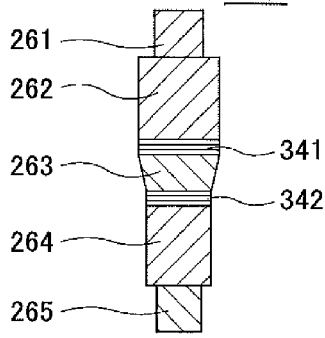

FIGS. 6A to 6C illustrate an electronic apparatus 300 of a third embodiment. FIG. 6A is a cross-sectional view of the electronic apparatus 300. FIG. 6B illustrates connection structures 240 and 340. FIG. 6C illustrates a connection structure 240A of a modified example.

The electronic apparatus 300 of the third embodiment has a structure where one center group among the 5 groups of connection structures 240 in the electronic apparatus 200 of the second embodiments is substituted for by a connection structure 340.

The connection structure 340 has a structure where the width of the post 262 is substituted for by the width of the post 264 in the connection structure 240 including the post 262, the solder layer 263, and the post 264.

Referring to FIGS. 6A to 6C, the same reference symbols are attached to the structural elements similar to those of the electronic apparatus 200, and description of these structural elements is omitted. Hereinafter, differences are mainly described.

The electronic apparatus 300 includes an IC chip 20, a pad 221, a passivation film 222, a via 261, a post 262, a solder layer 263, a post 264, a via 265, an underfill resin 266, a pad 231, a solder resist 232, and a wiring substrate 270.

The electronic apparatus 300 further includes a post 362, a solder layer 363, and a post 364.

Here, the via 261, the post 262, the solder layer 263, the post 264, and the via 265 form the connection structure 240. FIG. 6A illustrates 4 groups of connection structures 240. Here, the via 261, the post 362, the solder layer 363, the post 364, and the via 265 form the connection structure 340. The group of the connection structure 340 is arranged in the middle of 4 groups of the connection structure 240 as illustrated in FIG. 6A.

Referring to FIG. 6B, a width d21 of the via 261 and a height h21 of the post 362 are set so that a relationship of h21≥d21 is established. A width d22 of the via 265 and a height h22 of the post 364 are determined so that a relationship of hd2≥d22 is established.

In the connection structure 240, a width d23 of the post 262 is set wider than a width d24 of the post 264. Therefore, the solder layer 263 connecting the post 262 to the post 264 is shaped like a taper having greater width on the upper side and lesser width on the lower side in FIG. 6B.

In the connecting structure 340, the width d21 of the via 261 and the height h21 of the post 362 are set so that a relationship of h21≥d21 is established. The width d22 of the via 265 and the height h22 of the post 364 are determined so that a relationship of h22≥d22 is established.

This relationship is similar to that in the connection structure 240. The height h21 of the post 362 is equal to the height h21 of the post 262. The height h22 of the post 364 is equal to the height h22 of the post 264.

The width d33 of the post 362 is set to be less than the width d34 of the post 364. Therefore, the solder layer 363 connecting the post 362 to the post 364 is shaped like a taper having lesser width on the upper side and greater width on the lower side in FIG. 6B.

As described, in comparison of the connection structure 240 and the connection structure 340, the widths of the posts 262 and 264 are substituted for by the widths of the posts 362 and 364. The connection structure 240 has a greater width on the upper side (the side of the post 262). The connection structure 340 has a greater width on the lower side (the side of the post 364).

When the widths of the posts 262 and 264 are different between the upper side and the lower side of the solder layer 263, it is better for restricting concentration of electrons on the inlet side of the solder layer 263 by causing electrons to flow from the wider side of the solder layer 263 to the solder layer 263 and causing electrons to flow out of the narrower side of the solder layer 263. Thus, electromigration can be restricted.

Therefore, the connection structure 240 is preferably used such that electrons flow in the direction from the upper side to the lower side (from the IC chip 20 to the wiring substrate 270), i.e., from the wiring substrate 270 to the IC chip 20.

In a case where electrons flow from the via 261 to the post 262 (said differently, in a case where electrons flow from the IC chip 20 to the side of the wiring substrate 270), the via 261 is an example of the first connecting portion, the post 262 is an example of the first column electrode, the post 264 is an example of the second column electrode, and a via 265 is an example of the second connecting portion. In this case, the width of the post 262 as an example of the first column electrode is greater than the width of the post 264 as an example of the second column electrode.

Therefore, the connection structure 240 may be used for, for example, a wiring for supplying power to the IC chip 20 or a wiring for transferring a signal to the IC chip 20.

When the widths of the posts 362 and 364 are different between the upper side and the lower side of the solder layer 363, it is better for restricting concentration of electrons on an outlet side of the solder layer 363 by causing electrons to flow from a wider side of the solder layer 363 to the narrower side of the solder layer 363. Thus, electromigration can be restricted.

Therefore, the connection structure 340 is preferably used such that electrons flow in the direction from the lower side to the upper side (from the wiring substrate 270 to the IC chip 20), i.e., from the IC chip 20 to the wiring substrate 270.

In a case where electrons flow from the via 265 to the post 364 (said differently, in a case where electrons flow from the wiring substrate 270 to the IC chip 20), the via 265 is an example of the third connecting portion, the post 364 is an example of the third column electrode, the post 362 is an example of the fourth column electrode, and a via 261 is an example of the fourth connecting portion. In this case, the width of the post 364 as an example of the third column electrode is greater than the width of the post 362 as an example of the fourth column electrode.

Therefore, the connection structure 240 may be used for, for example, a ground wiring for ground or a wiring for transferring a signal to the wiring substrate 270.

Therefore, in the electronic apparatus 300 illustrated in FIG. 6A, 4 groups of the connection structure 240 may be used, for example, as a ground wiring for ground or a wiring for a signal transmitted from the IC chip 20 to the wiring substrate 270. One group of the connection structure 340 may be used, for example, as a wiring for supplying power to the IC chip 20 or a wiring for a signal transferred to the IC chip 20.

As described, by using the connection structure 240, electromigration in an interface between the post 264 and the solder layer 263 can be restricted and electromigration inside the solder layer 263 can be restricted.

Similarly, as described, by using the connection structure 340, electromigration in the interface between the post 362 and the solder layer 363 can be restricted and electromigration inside the solder layer 363 can be restricted.

In a case where electrons flow from the upper side to the lower side through the connection structure 240, it can be considered that the relationship of h22≥d22 is not established in the post 264 and the via 265, which are arranged on the downstream side of the flow of electrons relative to the solder layer 263. Therefore, the height and the width of the post 265 and the via 265 may be freely set.

In this case, restriction in designing the arrangement is released and efficiency of the manufacturing process can be obtained.

In a case where electrons flow from the lower side to the upper side through the connection structure 340, it can be considered that the relationship of h22≥d22 is not established in the post 362 and the via 261, which are arranged on the downstream side of the flow of electrons relative to the solder layer 363. Therefore, the height and the width of the post 362 and the via 261 may be freely set.

In this case, restriction in designing the arrangement is released and efficiency of the manufacturing process can be obtained.

Further, in a case where electrons flow from the via 261 to the post 262, it is preferable that the width d23 of the post 262 is greater than the width d21 of the via 261. This is because unbalance of the current density inside the post 262 can be restricted in a case where the width d23 of the post 262 on the side where electrons flow in is greater than the width d21 of the via 261 on the side where electrons flow out thereby causing the current density to be uniform.

This is the same between the via 265 and the post 264, the same between the via 261 and the post 362, and between the via 265 and the post 364.

Referring to the connection structure 240A illustrated in FIG. 6C, a barrier metal layer 341 may be provided between the post 262 and the solder layer 263. Similarly a barrier metal layer 342 may be provided between the post 264 and the solder layer 263.

The barrier metal layers 341 and 342 are, for example, a nickel layer. For example, the nickel layer as the barrier metal layers 341 and 342 may be formed by conduting a plating process on the lower surface of the post 262 and the upper surface of the post 264, respectively.

By using these barrier metal layers 341 and 342, electromigration of the solder layer 263 can be further effectively restricted.

Only one of the barrier metal layers 341 and 342 may be used.

According to the embodiments, it is possible to provide the connection structure, the wiring substrate unit, the electronic circuit part unit, and the electronic apparatus, which have high reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. An electronic apparatus comprising:
   an electronic circuit part;
   a wiring substrate;
   a first connecting portion having one end connected to the electronic circuit part;
   a first column electrode having one end connected to another end of the first connecting portion;
   a second column electrode having one end connected to another end of the first column electrode via solder;
   a second connecting portion having one end connected to another end of the second column electrode and having another end connected to the wiring substrate;
   a third connecting portion having one end connected to the wiring substrate;
   a third column electrode having one end connected to another end of the third connecting portion;
   a fourth column electrode having one end connected to another end of the third column electrode via another solder; and
   a fourth connecting portion having one end connected to another end of the fourth column electrode and having another end connected to the electronic circuit part,
   wherein a height of the first column electrode is equal to a width of the first connecting portion or greater, and
   a height of the third column electrode is equal to a width of the third connecting portion or greater.

2. The electronic apparatus according to claim 1,
wherein electrons flow from the one ends of the first column electrode, the second column electrode, the third column electrode, and the fourth column electrode to the another ends of the first column electrode, the second column electrode, the third column electrode, and the fourth column electrode through the first column electrode, the second column electrode, the third column electrode, and the fourth column electrode.

3. The electronic apparatus according to claim 1,
wherein a width of the first column electrode is greater than a width of the second column electrode, and
a width of the third column electrode is greater than a width of the fourth column electrode.

* * * * *